United States Patent
Zhang et al.

(10) Patent No.: US 9,515,253 B2
(45) Date of Patent: Dec. 6, 2016

(54) MAGNETIC READ HEAD WITH MR ENHANCEMENTS

(71) Applicant: Headway Technologies, Inc., Milpitas, CA (US)

(72) Inventors: Kunliang Zhang, Fremont, CA (US); Hui-Chuan Wang, Pleasanton, CA (US); Junjie Quan, Milpitas, CA (US); Yewhee Chye, Hayward, CA (US); Min Li, Fremont, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 14/748,872

(22) Filed: Jun. 24, 2015

(65) Prior Publication Data

US 2015/0295168 A1    Oct. 15, 2015

Related U.S. Application Data

(62) Division of application No. 13/732,598, filed on Jan. 2, 2013, now Pat. No. 9,082,872.

(51) Int. Cl.
*H01L 43/10* (2006.01)
*G01R 33/09* (2006.01)
*H01L 43/08* (2006.01)
*H01L 29/82* (2006.01)
*H01L 43/02* (2006.01)

(52) U.S. Cl.
CPC ............. *H01L 43/10* (2013.01); *G01R 33/093* (2013.01); *G01R 33/098* (2013.01); *H01L 29/82* (2013.01); *H01L 43/08* (2013.01); *H01L 43/02* (2013.01)

(58) Field of Classification Search
None
See application file for complete search history.

(56) References Cited

U.S. PATENT DOCUMENTS

| | | | |
|---|---|---|---|
| 7,672,088 B2 | 3/2010 | Zhang et al. | |
| 8,085,511 B2 | 12/2011 | Yuasa et al. | |
| 8,208,231 B2 | 6/2012 | Nishimura et al. | |
| 2006/0061915 A1 | 3/2006 | Zhang et al. | |
| 2007/0297103 A1 | 12/2007 | Zhang et al. | |
| 2008/0278864 A1 | 11/2008 | Zhang et al. | |
| 2009/0080124 A1 | 3/2009 | Yoshikawa et al. | |
| 2009/0207724 A1 | 8/2009 | Yanagi et al. | |
| 2010/0177449 A1* | 7/2010 | Zhao | B82Y 10/00 360/324.12 |
| 2011/0265325 A1* | 11/2011 | Zhang | H01F 10/3268 29/887 |

* cited by examiner

*Primary Examiner* — Khaja Ahmad
(74) *Attorney, Agent, or Firm* — Saile Ackerman LLC; Stephen B. Ackerman

(57) ABSTRACT

A TMR stack or a GMR stack, ultimately formed into a sensor or MRAM element, include insertion layers of Fe or iron rich layers of FeX in its ferromagnetic free layer and/or the AP1 layer of its SyAP pinned layer. X is a non-magnetic, metallic element (or elements) chosen from Ta, Hf, V, Co, Mo, Zr, Nb or Ti whose total atom percent is less than 50%. The insertion layers are between 1 and 10 angstroms in thickness, with between 2 and 5 angstroms being preferred and, in the TMR stack, they are inserted adjacent to the interfaces between a tunneling barrier layer and the ferromagnetic free layer or the tunneling barrier layer and the AP1 layer of the SyAP pinned layer in the TMR stack. The insertion layers constrain interdiffusion of B and Ni from CoFeB and NiFe layers and block NiFe crystalline growth.

21 Claims, 1 Drawing Sheet

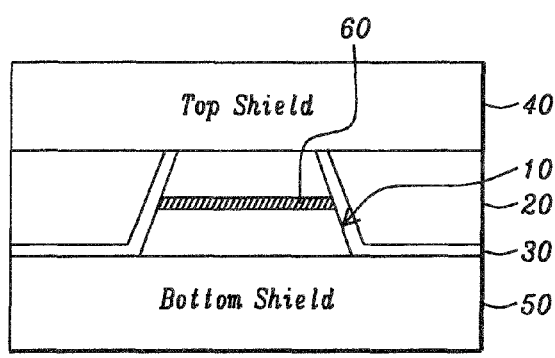
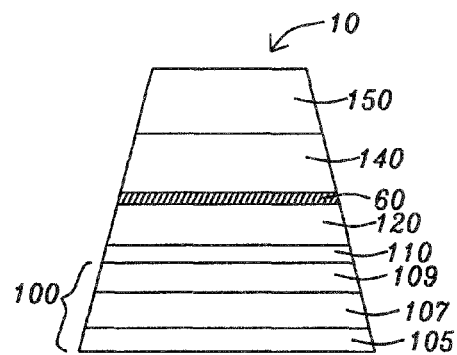
FIG. 1    FIG. 2
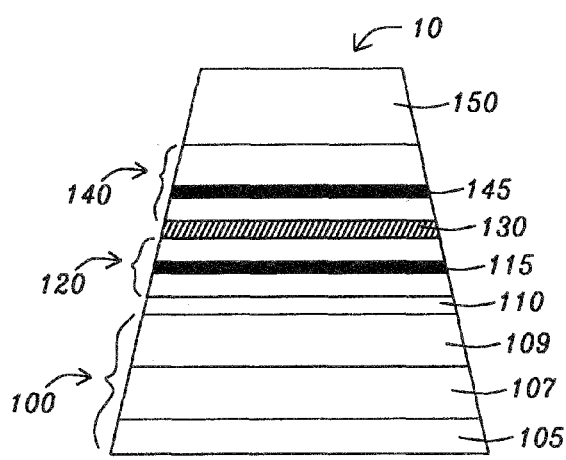
FIG. 3

MAGNETIC READ HEAD WITH MR ENHANCEMENTS

This is a Divisional application of U.S. patent application Ser. No. 13/732,598, filed on Jan. 2, 2013, which is herein incorporated by reference in its entirety and assigned to a common assignee.

BACKGROUND

1. Technical Field

This disclosure relates generally to thin-film magnetoresistive read sensors and particularly to the enhancement of the magnetoresistive properties of such sensors by the insertion of additional layers.

2. Description

In simplest form, the usual giant magnetoresistive (GMR) read sensor consists of two magnetic layers, formed vertically above each other in a parallel planar configuration and separated by a conducting, but non-magnetic, spacer layer. Each magnetic layer is given a unidirectional magnetic moment within its plane and the relative orientations of the two planar magnetic moments determines the electrical resistance that is experienced by a current that passes from magnetic layer to magnetic layer through the spacer layer. The physical basis for the GMR effect is the fact that the conduction electrons are spin polarized by interaction with the magnetic moments of the magnetized layers. This polarization, in turn, affects their scattering properties within the layers and, consequently, results in changes in the resistance of the layered configuration. In effect, the configuration is a variable resistor that is controlled by the angle between the magnetizations.

The magnetic tunneling junction device (TMR device) is an alternative form of GMR sensor in which the relative orientation of the magnetic moments in the upper and lower magnetized layers controls the flow of spin-polarized electrons tunneling through a very thin dielectric layer (the tunneling barrier layer) formed between those magnetized layers. When injected electrons pass through the upper layer, as in the GMR device, they are spin polarized by interaction with the magnetization direction (direction of its magnetic moment) of that layer. The probability of such an electron then tunneling through the intervening tunneling barrier layer into the lower magnetic layer then depends on the availability of states within the lower layer that the tunneling electron can occupy. This number, in turn, depends on the magnetization direction of the lower layer. The tunneling probability is thereby spin dependent and the magnitude of the current (tunneling probability multiplied by the number of electrons impinging on the barrier layer) depends upon the relative orientation of the magnetizations of magnetic layers above and below the barrier layer.

In what is called a spin-valve configuration, one of the two magnetic layers in both the GMR and TMR has its magnetization fixed in spatial direction (the pinned layer), while the other layer (the free layer) has its magnetization free to move in response to an external magnetic stimulus. If the magnetization of the free layer is allowed to move continuously, as when it is acted on by a continuously varying external magnetic field, the GMR and TMR device each effectively acts as a variable resistor and it can be used as a read-head in a hard disk drive. If the magnetization of the free layer is only permitted to take on two orientations, parallel and antiparallel to that of the pinned layer, then the device can be used to store information (eg. 0 or 1, corresponding to the free layer magnetization orientation) as an MRAM cell.

The difference in operation between the GMR sensor and the TMR sensor, is that the resistance variations in the former are a direct result of changes in the electrical resistance (due to spin polarized electron scattering) within the three-layer configuration (magnetic layer/non-magnetic conducting layer/magnetic layer), whereas in the TMR sensor, the amount of current is controlled by the availability of states for electrons that tunnel through the dielectric barrier layer that is formed between the free and pinned layers.

When the TMR configuration is used as a sensor or read head, (called a TMR read head, or "tunneling magnetoresistive" read head) the free layer magnetization is required to move about a central bias position by the influence of the external magnetic fields of a recorded medium, such as is produced by a moving hard disk or tape. As the free layer magnetization varies in direction, a sense current passing between the upper and lower electrodes and tunneling through the dielectric barrier layer varies in magnitude as more or less electron states become available. Thus a varying voltage appears across the electrodes (which may be the magnetic layers themselves). This voltage, in turn, is interpreted by external circuitry and converted into a representation of the information stored in the medium.

A typical bottom spin valve GMR sensor structure is the following: Seed/AFM/outer pinned (AP2)/Ru/inner pinned (AP1)/Cu/Free Layer/Capping Layer.

A typical bottom spin valve TMR sensor structure is the following: Seed/AFM/outer pinned (AP2)/Ru/inner pinned AP1)/MgO/Free Layer/Capping Layer, In the TMR configuration shown above (and in the CPP GMR as well), the seed layer is an underlayer required to form subsequent high quality magnetic layers. The AFM (antiferromagnetic layer) is required to pin the pinned layer, ie., to fix the direction of its magnetic moment by exchange coupling. The pinned layer itself is now most often a synthetic antiferromagnetic (SyAF) (also termed a synthetic antiparallel (SyAP)) structure with zero total magnetic moment. This structure is achieved by forming an antiferromagnetically coupled tri-layer whose configuration is denoted herein as "outer pinned (AP2)/Ru/inner pinned (AP1)", which is to say that two ferromagnetic layers, the outer (farthest from the free layer) and inner (closest to the free layer) pinned layers which are denoted AP2 and AP1 respectively, are magnetically coupled across a Ru spacer layer in such a way that their respective magnetic moments are mutually antiparallel and substantially cancel each other. The structure and function of such SyAP structures is well known in the art and will not be discussed in further detail herein.

In the GMR sensor (i.e., used as a read head) there is an electrically conducting but non-magnetic spacer layer (typically of Cu) that separates the free and pinned layers. This conducting, but non-magnetic Cu spacer layer in the GMR is replaced in the TMR by a thin insulating (dielectric) layer of (for example) oxidized magnesium (MgO) that can be oxidized in any of several different ways to produce an effective dielectric tunneling barrier layer. The free layer in both the GMR and TMR is usually a bilayer of ferromagnetic material such as CoFeB/NiFe, and the capping layer in both the GMR and TMR is typically a layer of tantalum (Ta). The bilayer choice for the free layer is strongly suggested by the fact that an effective free layer should be magnetically soft (of low coercivity), which is an attribute of the CoFeB layer. The CoFeB layer, however, exhibits excessive magnetostriction. By adding the NiFe layer, the magnetostriction is reduced, but unfortunately, the TMR ratio, dR/R, (ratio of maximum resistance variation as the free layer magnetic moment changes direction, dR, to total device resistance, R), which is a measure of its efficacy as a read sensor (or MRAM element), will also be reduced. We shall see below that the structure of the free layer can be significantly altered to provide an improved TMR sensor or MRAM element as well as a GMR sensor or MRAM element. We note that the vertical positioning of the free and pinned layers may be reversed, to form either what are called "bottom spin valves" (as shown here) and, alternatively "top spin valves" with the free layer formed on the seed layer and the pinned layer vertically above the free layer.

Much recent experimentation on GMR sensors has been directed at improvements in the free layer structure. The most common structure in both the GMR and TMR sensor had been a CoFeB/NiFe bilayer, in which the NiFe layer provides the low magnetostriction, while the CoFeB provides good magnetic softness. More recently, attempts have been made to improve the magnetic properties of both free and pinned layers by utilizing novel materials and laminated structures. Examples of such attempts, which differ from and do not achieve the results of the present disclosure, are to be found in:

U.S. Pat. No. 7,672,088 (Zhang et al), which is assigned to the present assignee.
U.S. Pat. No. 8,208,231 (Nishimura et al.)
U.S. Pat. No. 8,085,511 (Yuasa et al.)

SUMMARY

An object of this disclosure is to form a (top or bottom spin valve) TMR (or, alternatively, a GMR) sensor or a TMR or GMR MRAM element that combines a high TMR or GMR ratio and a low free layer coercivity while retaining other advantageous properties.

An additional object of this invention is to provide such devices in which B atom interdiffusion from a CoFeB electrode layer (the magnetic layer into which electrons are injected or from which they are removed), in either AP1 or the free layer, is contained.

Still a further object of this invention is to provide such devices in which Ni atom interdiffusion is contained and NiFe crystalline growth is blocked, for a NiFe electrode layer in the free layer.

These objects will be met by either a top or bottom spin valve GMR or TMR sensor or MRAM element, but with emphasis herein being on the description of a TMR sensor, in which there is formed a free layer or pinned layer (AP1) in which there are inserted thin (1-10 angstroms) iron (Fe) layers or iron rich layers of the alloy FeX, where X is at least one of the non-magnetic, metallic elements Ta, Hf, V, Co, Mo, Zr, Nb or Ti, combined with the Fe in amounts less than 50% by atomic percent, or, equivalently, with the Fe atom percent being at least 50%.

BRIEF DESCRIPTION OF THE DRAWINGS

FIG. 1 is a schematic representation of an ABS view of a typical MTJ sensor that is patterned, biased longitudinally and shielded.

FIG. 2 is a schematic representation of the MTJ TMR stack in the sensor of FIG. 1, showing the layer structure in greater detail.

FIG. 3 is a schematic representation of a MTJ TMR stack similar to that of FIG. 2, except that layers of Fe and/or FeX alloys have been inserted in positions where they will achieve the objects of this disclosure.

DETAILED DESCRIPTION

The present disclosure is a (top or bottom spin valve) TMR (or GMR) stack from which is formed a sensor or MRAM structure of good areal resistance, good free layer coercivity and improved magnetoresistive (MR) ratio (dR/R), provided by the insertion of thin layers of Fe or iron-rich alloys of FeX into the free layer and/or the pinned layer structures. The inserted layers are characterized as having an atom percent of Fe of at least 50%, and where X is chosen from one or several of the non-magnetic metallic elements Ta, Hf, V, Co, Mo, Zr, Nb or Ti.

The improvement in performance is obtained by introducing these layers at positions within the stack where they can contain (or constrain) the interdiffusion of B from a CoFeB layer formed as an element of the free or pinned layers and/or contain (or constrain) the interdiffusion of Ni from an NiFe layer or halt the crystallization of the NiFe layer, where that NiFe layer is formed as an element of the free layer. The Fe or FeX layers are formed to a thickness between approximately 1 and 10 angstroms, with the approximate range between 2 and 5 angstroms being preferable. It is noted that these performance improvements will accrue to both TMR sensors (e.g. read elements having a variable free layer magnetic moment) and to TMR MRAM elements (having essentially a bi-stable, bi-directional free layer magnetic moment that is maintained by layer anisotropy) and can also be effective in improving the performance of GMR sensor and MRAM elements. In addition, the structures can equally well be of the bottom or top configurations where the vertical positions of free and pinned layers are essentially interchanged.

To improve the TMR ratio of the current MTJ devices with MgO barrier layer as shown in FIGS. 1 and 2, it is important to improve the lattice matching between the AP1 layer of the bottom magnetic electrode (the SyAF pinned layer), and/or the top magnetic electrode (the free layer) with the MgO barrier layer. Also there is a need to improve the growth conditions of the AP1 layer, the MgO barrier layer and the free layer depositions. It is well known that Fe or Fe-rich FeX alloy (X=at least one from Ta, Hf, V, Co, Mo, Zr, Nb, Ti etc) with doping with X material of less than 50% has a much better wetting with the MgO barriers compared with Co or Co-rich alloys; also, such Fe or FeX alloys have a much smaller lattice mismatch with the MgO barrier. Therefore, with such a thin Fe layer or FeX alloy layer insertion in AP1 and/or the free layer, MR enhancement is expected. A picture of such an improved TMR stack is illustrated in FIG. 3 and will be discussed below.

Referring first to FIG. 1, there is shown a schematic ABS view of a patterned, biased and shielded typical MTJ (magnetic tunneling junction) sensor such as might be used to read recorded magnetic data. With only minor changes, the illustration can be applied as well to an MTJ MRAM element or a GMR sensor or MRAM element, the MRAM being used to store binary data. In what follows, we will denote the as-deposited configuration of layers as the "stack." Once the stack is patterned and magnetized appropriately (either in vertical cross-section and/or horizontal cross-section) and provided with shields and biasing layers, it will become either a sensor (i.e. a read sensor) or an MRAM element.

The patterned sensor stack (10), which is shown here as being a thin-film TMR (tunneling magneto-resistive) stack, is laterally abutted by longitudinal biasing layers (20), usually formed of a hard magnetic material, and separated from the stack itself by an insulating layer (30). The patterned stack is formed between an upper shield (40) and a lower shield (50) that shields it from extraneous magnetic fields. It is understood that the arrangement of the shields would be different if the stack were formed as an MRAM element. At the approximate center (vertically) of the stack is found the defining tunneling barrier layer (60), which controls the flow of polarized electrons through quantum-mechanical tunneling and the availability of states for the electrons.

Referring next to FIG. 2, there is shown, schematically, an isolated and more detailed illustration of the stack (10) of FIG. 1. In this figure there is shown a lower layer (100) which includes a seed layer (105), an antiferromagnetic (AFM) pinning layer (107) and layer AP2 (109) of an antiferromagnetically (antiparallel magnetic moments) coupled pinned layer, symbolized SyAP hereinafter. AP2 is typically a layer of ferromagnetic material.

Formed on lower layer (100) there is shown a coupling layer (110), here formed of Ru, which provides an antiferromagnetic coupling between layer AP2 (109) and another ferromagnetic layer, AP1 (120), formed immediately above it and contiguous with it.

Formed on the coupling layer (110), there is the above-mentioned second ferromagnetic layer, denoted AP1 (120), which together with AP2 and the intermediate coupling layer, forms a tri-layer that behaves as a synthetic antiferromagnetic structure (denoted SyAP). Layer AP1 is also called a reference layer because the direction of its fixed magnetic moment provides a fixed reference line with which the free magnetic moment of the free layer to forms an angle.

Formed on AP1 (120) there is the tunneling barrier layer (60), typically a layer of MgO, which is a thin non-conducting layer. Quantum mechanically, even though the layer is classically non-conducting, a perpendicular flow of electrons can nevertheless pass through this barrier layer with a certain probability that depends on the spin direction of the electrons and the magnetization direction of AP1. If the structure were a GMR rather than a TMR, the barrier layer would be replaced by a non-magnetic, electrically conducting spacer layer, such as a layer of Cu, through which electrons can pass.

Formed on the tunneling barrier layer (60) there is magnetically free layer (140) of ferromagnetic material, it being "free" in the sense that its magnetic moment if free to move under the influence of external magnetic fields.

Finally, formed on the free layer (140) is a capping layer (150), typically a layer of Ta, which serves several purposes, including to protect the stack during processing and to provide a good electrical contact for the current.

Referring finally to FIG. 3, there is shown, schematically, the stack (10) of FIG. 2 in which there has been inserted the Fe and FeX layers of this disclosure ((115) and (145)). In this figure there is shown a lower layer configuration (100) which includes a seed layer (105), an antiferromagnetic (AFM) pinning layer (107) and the ferromagnetic layer AP2 (109) portion of an antiferromagnetically coupled pinned layer. AP2 is typically a layer of ferromagnetic material such as CoFe with Fe percent >20%, or laminations of CoFe(y %)/FeCo(z %)/CoFe(y %), with y %>5% and z %<50%. Furthermore, ferromagnetic layers AP1 and the ferromagnetic free layer, are typically formed as layers of CoFeB and CoFe and, in the free layer only, there is also a layer of NiFe. As mentioned above, these alloys enable the ferromagnetic free layer to have both the softness (low coercivity) of the CoFeB and the low magnetostriction of the NiFe. Note, however that NiFe is not preferred as a component of AP1 because of adverse effects on the pinning fields and reduction of the MR ratio.

Formed on lower layer configuration (100), there is shown a coupling layer (110), here formed of Ru, which provides an antiferromagnetic coupling between layer AP2 (109) and layer AP1 (120) formed immediately above it and contiguous with it.

Formed on the coupling layer (110), there is a second ferromagnetic layer, denoted AP1 (120), which together with AP2 and the intermediate coupling layer, forms a tri-layer that behaves as a synthetic antiferromagnetic structure (denoted SyAP). Layer AP1 is called a reference layer because the direction of its fixed magnetic moment provides a fixed reference line with which the free magnetic moment of the free layer to forms an angle. Unlike the corresponding AP1 layer of FIG. 2, there is formed in the present AP1 layer an inserted layer (115) of Fe or FeX alloys. Although only a single insertion layer is shown for simplicity, multiple layers are possible, with the multiple layers (laminations) being all of the same alloy composition, or being a variety of such compositions, each of the form Fe or FeX, with X being one or more of the non-magnetic, metallic elements Ta, Hf, V, Co, Mo, Zr, Nb or Ti and where the atom percentage of X is less than 50% so that the layer is iron-rich. Thus, in an AP1 layer formed with laminates of CoFeB/CoFe, the layer with the final multiple insertions could have the form:

CoFe/FeX$_1$/CoFe/CoFeB/FeX$_2$/CoFe,

Where X$_1$ could be Ta, X$_2$ could be Hf or the FeX could be just Fe itself.

The insertion layer (each insertion layer if more than one is present) has a thickness of between approximately 1 and 10 angstroms with between 2 and 5 angstroms being preferred.

Formed on AP1 (120) there is a tunneling barrier layer (130), typically a layer of MgO, which is a thin non-conducting layer. Quantum mechanically, a perpendicular flow of electrons can pass through this barrier layer with a certain probability that depends on the spin direction of the electrons and the magnetization direction of AP1.

Formed on the tunneling barrier layer (130) there is the magnetically free layer (140) of ferromagnetic material, it being "free" in the sense that its magnetic moment if free to move under the influence of external magnetic fields. Unlike the magnetically free layer of FIG. 2, however, this free layer includes a multiplicity (only one being shown here) of insertion layers (145) of the form Fe or FeX, where X is Ta, Hf, V, Co, Mo, Zr, Nb or Ti and where the atom percentage of X is less than 50% so that the layer is iron-rich. Each insertion layer has a thickness of between approximately 1 and 10 angstroms with between 2 and 5 angstroms being preferred.

Finally, formed on the free layer (140) is a capping layer (150), typically a layer of Ta, which serves several purposes, including to protect the stack during processing and to provide a good electrical contact for the current.

When the free layer and/or the AP1 layer comprise bilayer structures of CoFeB, CoFe and, (for the free layer only), also NiFe, the insertion layers are preferably located next to the NiFe portion of the free layer to constrain interdiffusion of the Ni atoms and to block NiFe crystalline growth and next to the CoFeB layer to constrain interdiffusion of the B atoms. The Fe layer and the FeX insertion layers are not preferred to be immediately adjacent to the MgO layer as the Fe or FeX layer tends to attract some oxygen from the MgO. Note also that for the CoFeB/CoFe structure of the AP1 layer, it is preferred that the CoFe layer be immediately adjacent to the MgO layer. With the Fe or FeX insertions, however, it is preferred to have the configuration CoFeB/FeX/CoFe or its laminations, with the CoFe layer deposited on top. For the free layer, it is preferred that the configuration: CoFe/CoFeB/NiFe, have NiFe on top and the CoFe on the bottom where it is closest to the MgO layer. In the preferred structure of this disclosure, CoFeB should not be immediately adjacent to the MgO because of interdiffusion concerns. From a crystallinity perspective, it should be pointed out that the Fe or FeX layer insertion is directed at preventing B interdiffusion into the MgO tunneling barrier layer and, due to the Fe or FeX BCC (body centered cubic) crystal structure it would prevent NiFe FCC (face centered cubic) structure crystallization intrusion towards the MgO layer. The NiFe layer is usually FCC structure and it the MR ratio would be degraded should the MgO become FCC.

The fabrication process preferred for the (top or bottom) TMR (or GMR) sensor or MRAM element is advantageously similar to the processes currently in use to produce such sensors or MRAM elements that do not include the insertion layers. Specifically, the layer stack would be formed with the chosen insertion layers deposited at their positions within the AP1 layer of the pinned layer and/or the free layer. Then the stack would be patterned and magnetized in accord with its ultimate use as a sensor or MRAM element, longitudinal biasing layers would be applied and appropriate top and bottom shields would be formed as required.

As is understood by a person skilled in the art, the present description is illustrative of the present disclosure rather than limiting of the present disclosure. Revisions and modifications may be made to methods, materials, structures and dimensions employed in forming and providing a TMR or GMR stack with enhanced MR properties incorporating insertion layers of Fe or FeX in free and/or pinned layers, while still forming and providing such a structure and its method of formation in accord with the spirit and scope of the present invention as defined by the appended claims.

What is claimed is:

1. A giant magnetoresistive (GMR) stack comprising:
a seed layer;
a pinning layer formed on said seed layer;
a synthetic antiparallel (SyAP) layer formed on said pinning layer and magnetically coupled thereto, wherein said SyAP layer is formed as an antiferromagnetically coupled pair of ferromagnetic layers denoted AP1 and AP2, said ferromagnetic layers being separated by a non-magnetic coupling layer, and wherein layer AP2 is formed on said pinning layer; and wherein said AP1 layer incorporates a first plurality of insertion layers of the form Fe or FeX or multiple laminations thereof;
an electrically conducting, non-magnetic spacer layer formed on said AP1 layer;
a ferromagnetic free layer formed on said electrically conducting, non-magnetic spacer layer, said ferromagnetic free layer including a second plurality of insertion layers of the form Fe or FeX wherein X is one or more of the metallic, non-magnetic elements Ta, Hf, V, Mo, Zr, Nb or Ti, or multiple laminations of combinations thereof that are inserted to prevent interdiffusion and block crystallization; and
a capping layer formed on said ferromagnetic free layer.

2. A giant magnetoresistive (GMR) stack comprising:
a seed layer;
a pinning layer formed on said seed layer;
a synthetic antiparallel (SyAP) layer formed on said pinning layer and magnetically coupled thereto, wherein said SyAP layer is formed as an antiferromagnetically coupled pair of ferromagnetic layers denoted AP1 and AP2, said ferromagnetic layers being separated by a non-magnetic coupling layer, and wherein layer AP2 is formed on said pinning layer; and wherein said AP1 layer incorporates a plurality of insertion layers of the form Fe or FeX wherein X is one or more of the metallic, non-magnetic elements Ta, Hf, V, Mo, Zr, Nb or Ti, or multiple laminations of combinations thereof that are inserted to block interdiffusion and to prevent crystallization;
a non-magnetic, electrically conducting spacer layer formed on said AP1 layer; and
a ferromagnetic free layer formed on said non-magnetic, electrically conducting spacer layer; and
a capping layer formed on said ferromagnetic free layer.

3. A giant magnetoresistive (GMR) stack comprising:
a seed layer;
a pinning layer formed on said seed layer;
a synthetic antiparallel (SyAP) layer formed on said pinning layer and magnetically coupled thereto, wherein said SyAP layer is formed as an antiferromagnetically coupled pair of ferromagnetic layers denoted AP1 and AP2, said ferromagnetic layers being separated by a non-magnetic coupling layer, and wherein layer AP2 is formed on said pinning layer;
a non-magnetic electrically conducting spacer layer formed on said AP1 layer; and
a ferromagnetic free layer formed on said non-magnetic electrically conducting spacer layer, wherein said ferromagnetic free layer includes a plurality of insertion layers of the form Fe or FeX wherein X is one or more of the metallic, non-magnetic elements Ta, Hf, V, Mo, Zr, or multiple laminations of combinations thereof that are inserted to block interdiffusion and prevent crystallization; and
a capping layer formed on said ferromagnetic free layer.

4. The GMR stack of claim 1 wherein the total atom percent of X is less than 50%.

5. The GMR stack of claim 2 wherein the total atom percent of X is less than 50%.

6. The GMR stack of claim 3 wherein the total atom percent of X is less than 50%.

7. The GMR stack of claim 1 wherein said first or second plurality of insertion layers of Fe or FeX are formed to a thickness between approximately 1 angstrom and 10 angstroms.

8. The GMR stack of claim 2 wherein said plurality of insertion layers of Fe or FeX are formed to a thickness between approximately 1 angstrom and 10 angstroms.

9. The GMR stack of claim 3 wherein said plurality of insertion layers of Fe or FeX are formed to a thickness between approximately 1 angstrom and 10 angstroms.

10. The GMR stack of claim 1 wherein said ferromagnetic free layer comprises bilayer structures of CoFeB/NiFe, or CoFe/NiFe, and wherein an insertion layer of the second plurality of insertion layers of Fe or FeX is inserted adjacent to said NiFe layer to constrain Ni interdiffusion and to block crystallization of NiFe, or is inserted next to the CoFeB layer to constrain interdiffusion of B atoms.

11. The GMR stack of claim 1 wherein said ferromagnetic free layer is formed as either of the sequential layers of CoFeB/NiFe/Fe or CoFeB/NiFe/FeX or CoFeB/FeX/NiFe or CoFeB/Fe/NiFe, whereby said second plurality of insertion layers of Fe or FeX is adjacent to said electrically conducting non-magnetic spacer layer and wherein said second plurality of insertion layers constrains B and Ni interdiffusion and blocks crystallization of NiFe.

12. The GMR stack of claim 2 wherein said ferromagnetic free layer comprises the bilayer structures CoFeB/NiFe, or CoFe/NiFe, and wherein an insertion layer of the plurality of insertion layers of Fe or FeX is inserted adjacent to said NiFe layer to constrain Ni interdiffusion and to block crystallization of NiFe, or is inserted next to the CoFeB layer to constrain interdiffusion of the B atoms.

13. The GMR stack of claim 2 wherein said ferromagnetic free layer is formed as either of the sequential layers CoFeB/NiFe/Fe or CoFeB/NiFe/FeX or CoFeB/FeX/NiFe or CoFeB/Fe/NiFe, whereby an insertion layer of the plurality of insertion layers Fe or FeX is adjacent to said tunneling barrier layer and wherein said insertion layer constrains B and Ni interdiffusion and blocks crystallization of NiFe.

14. The GMR stack of claim 3 wherein said ferromagnetic free layer is formed as either of the sequential layers of CoFeB/NiFe/Fe or CoFeB/NiFe/FeX or CoFeB/FeX/NiFe or CoFeB/Fe/NiFe, whereby an insertion layer or Fe or FeX is adjacent to said electrically conducting non-magnetic spacer layer and wherein said insertion layer constrains B and Ni interdiffusion and blocks crystallization of NiFe.

15. The GMR stack of claim 3 wherein said ferromagnetic free layer comprises bilayer structures of CoFeB/NiFe, or CoFe/NiFe, and wherein said insertion layer of the plurality of insertion layers of Fe or FeX is inserted adjacent to said NiFe layer to constrain Ni interdiffusion and to block crystallization of NiFe, or is inserted next to the CoFeB layer to constrain interdiffusion of the B atoms.

16. The GMR stack of claim 1 formed as a sensor device in either a top or bottom configuration.

17. The GMR stack of claim 1 formed as an MRAM device in either a top or bottom configuration.

18. The GMR stack of claim 2 formed as a sensor device in either a top or bottom configuration.

19. The GMR stack of claim 2 formed as an MRAM device in either a top or bottom configuration.

20. The GMR stack of claim 3 formed as a sensor device in either a top or bottom configuration.

21. The GMR stack of claim 3 formed as an MRAM device in either a top or bottom configuration.

* * * * *